United States Patent [19]

Sakano et al.

[11] Patent Number: 5,173,909
[45] Date of Patent: Dec. 22, 1992

[54] WAVELENGTH TUNABLE LASER DIODE

[75] Inventors: Shinji Sakano, Hachiohji; Akihiko Oka, Musashino; Katutoshi Saito, Higashi-Yamato; Naoki Chinone, Chofu, all of Japan

[73] Assignee: Hitachi, Ltd., Tokyo, Japan

[21] Appl. No.: 720,691

[22] Filed: Jun. 25, 1991

[30] Foreign Application Priority Data

Jul. 13, 1990 [JP] Japan .................................. 2-184316

[51] Int. Cl.$^5$ .................................. H01S 3/10
[52] U.S. Cl. .................................. 372/20; 372/34; 372/36
[58] Field of Search .................................. 372/20, 34, 36

[56] References Cited

U.S. PATENT DOCUMENTS

| | | | |
|---|---|---|---|
| 4,829,532 | 5/1989 | Kane | 372/20 |
| 4,873,691 | 10/1989 | Uomi et al. | 372/20 |

FOREIGN PATENT DOCUMENTS 3737191  5/1989  Fed. Rep. of Germany ........ 372/20

OTHER PUBLICATIONS

Electronics Letters, Jul. 20, 1989, vol. 25, No. 15, pp. 990–991.
Electronics Letters, Jan. 4, 1990, vol. 26, No. 1, pp. 46–47.

*Primary Examiner*—Georgia Y. Epps
*Attorney, Agent, or Firm*—Kenyon & Kenyon

[57] ABSTRACT

A wavelength tunable laser diode comprising a temperature variable heater separated from an active layer by a distance less than the thickness of a compound semiconductor substrate. Because the heater is located very close to the active layer, the response time of temperature change is improved. That in turn widens the tunable range of the laser diode.

10 Claims, 2 Drawing Sheets

WAVELENGTH TUNABLE LASER DIODE

BACKGROUND OF THE INVENTION

The present invention relates to a wavelength tunable laser diode and, more particularly, to a wavelength tunable laser diode especially suitable for use with coherent optical communication systems.

Wavelength-division-multiplexing communication involves having a light beam of multiple wavelength carry signals so as to transmit data of multiple channels over a single optical fiber cable. Thus an increased transmission capacity is made available with this method. In this case, the receiver side requires installing a laser diode for a local oscillator. The laser diode allows the receiver to tune in through interference to signals of a specific wavelength out of the received wavelength-division-multiplexed light. Generally, a wavelength tunable laser diode is used as the laser diode for the local oscillator. The wavelength tunable laser diode permits selection of signals of any specific wavelength out of a plurality of wavelengths in the received light. This laser diode must meet three requirements: (1) the tunable range must be wide; (2) the spectral line width must be narrow enough to permit utilization of interference; and (3) the optical output power must be high so as to improve the S/N ratio for the signal.

A first example of the prior art wavelength tunable laser diode is one described in "Electronics Letters," Vol. 25, No. 15 (1989), pp. 990-991. With a grating arrangement inside, this laser diode is a distributed feedback laser diode having a device length of 1.2 mm. The large device length allows the electrode arrangement to be divided into a plurality of electrodes. Varying the injecting current ratio between the multiple electrodes provides a laser beam having a tunable range of 2.2 nm, an optical output power of 20 mW or more and a spectral line width of 1 MHz or less.

A second example of the prior art wavelength tunable laser diode is one described in "Electronics Letters," Vol. 26, No. 1 (1990), pp. 46-47. This is a distributed feedback laser diode with a waveguide inserted therein, the waveguide varying the refractive index. The laser diode of this structure provides a tunable range of 7 nm while its optical output is as low as 4 mW or less.

A third example of the prior art wavelength tunable laser diode is one that utilizes one known laser diode characteristic: that the wavelength typically varies at a rate of 0.1 nm/°C. The laser diode of the above characteristic is attached to a Peltier device used for temperature control. As the temperature of the laser diode is varied, the wavelength emitted therefrom is controlled accordingly.

With the first prior art example comprising multiple electrodes, the reflecting band width of 3 nm for the internal grating limits the tunable range to about 3 nm. Given that constraint, it is difficult to widen the tunable range to 4 nm or more.

With the second prior art example incorporating the refractive-index-tuning waveguide, the carrier doped to vary the refractive index worsens the optical output power through absorption. Given that kind of laser diode, it is impossible to obtain an optical output of 10 mW or higher.

With the third prior art example that uses the Peltier device for laser diode temperature control, the response time of temperature change is prolonged. That is, wavelengths are switched in units of as long as seconds. This is because the Peltier device is attached to the back of the substrate detached from an active layer of the laser diode, with the result that the temperature of the whole laser diode can only be controlled from the back of the substrate.

As described, the conventional wavelength tunable laser diodes have yet to fulfill in practical terms the requirements of output, tunable range and response time at the same time. There has been an urgent need to develope a laser diode that would meet all such requirements.

SUMMARY OF THE INVENTION

It is therefore an object of the present invention to overcome the above-described drawbacks and disadvantages and to provide a wavelength tunable laser diode which provides a high optical output power, a wide tunable range and a high wavelength switching speed.

It is another object of the present invention to provide a practical wavelength tunable laser diode which provides an optical output power of 10 mW or higher, a spectral line width of 10 MHz or less, a tunable range of 4 nm or more, and a response time on the order of $10^{-3}$ seconds (1ms) or less.

In achieving the foregoing and other objects of the invention and according to one aspect thereof, there is provided a wavelength tunable laser diode comprising a semiconductor substrate, an active layer and a temperature variable heater, wherein the temperature variable header is separated from the active layer by a distance less than the thickness of the semiconductor substrate, the temperature of the heater being controlled so as to vary the wavelength of the output light beam from the laser diode.

According to another aspect of the invention, there is provided a wavelength tunable laser diode comprising at least: a semiconductor substrate; a first semiconductor layer formed on the semiconductor substrate and constituting an active layer whose band gap energy is less than that of the semiconductor substrate; a second semiconductor layer formed on the semiconductor substrate and having the polarity type opposite to that of the semiconductor substrate; and electrodes formed above the second semiconductor layer and under the first semiconductor layer, the electrodes being used for carrier injection; wherein a resistance film is deposited as a temperature variable heater on the electrode above the second semiconductor layer with an insulation film interposed between the film and the electrode. This constitution provides very favorable results.

According to the invention, the temperature variable heater is located near the active layer. This means that the temperature around the active layer is varied at a high rate. In particular, the heater may be deposited on the upper-surface electrode opposite to the semiconductor substrate facing the active layer. In that case, there exists no thick semiconductor substrate having a high thermal capacity between the heater and the active layer. This structure makes the response time of temperature change around the active layer shorter than ever before as the temperature of the heater is varied. When the temperature around the active layer changes, the refractive index around the active layer varies correspondingly. Where the oscillation wavelength of the laser diode is 1.55 μm, the wavelength thereof varies at a rate of 0.1 nm/°C. Thus if the temperature around an active layer 1 in FIG. 1 is changed by 40° C., a tunable oscillation wavelength range of approximately 4 nm is made available.

When the resistance film is used as the heater located on the device surface very close to the active layer, the distance between the heater and the active layer is as short as several μm, compared with about 200 μm, i.e., the typical thickness of the prior art semiconductor substrate. Thus controlling the heater temperature with the wavelength tunable laser diode of the invention makes the response time of temperature change near the active layer significantly shorter than conventional temperature-controlled wavelength tunable laser diodes.

FIGS. 2a graphically shows how the response time varies when temperature is varied from 20° C. to 60° C. on a 200 μm thick InP substrate. A curve 10 plots response time measurements taken when the heater is located at the back of the substrate, and another curve 11 plots response time measurements in effect when the heater is provided over the entire substrate surface.

When temperature is controlled from the back of the substrate, the heat dissipates throughout the substrate and thus a time delay of about 0.03 ms is experienced, as indicated by the curve 10. When the heater is provided over the entire surface of the substrate whose back is kept to a constant 20° C., no time delay occurs; the response is immediate.

If the resistance film deposited as the heater over the substrate surface is made substantially the same in width as the active layer, the response time is further shortened. Because the active layer is formed near the surface where the resistance film is deposited as the heater, making the heater width the same as that of the active layer allows the temperature of the active layer 1 to be raised with very little heat dissipation. This setup makes the width of the heater less than if the entire surface of the substrate is heated. Since the change in temperature is dependent on the power density per unit area, the power density is raised when the heater width is reduced. The raised power density leads to higher energy efficiency, which in turn improves the response time of temperature change significantly.

Referring to FIGS. 2b, a curve 13 plots response time measurements taken when the heater is provided over the entire width of an InP substrate 400 μm wide; another curve 12 plots response time measurements taken when a heater 10 μm wide is provided on the surface of the InP substrate 400 μm wide. In either case, the heater is deposited on the surface of the InP substrate. The graphic representation of FIG. 2B shows that when the heater is made smaller in width than the substrate, the power density is boosted. In turn, the raised power density makes the response time higher by about one order of magnitude than when the heater is provided over the entire substrate surface. Where a resistance film 10 μm wide is used, the injection power is reduced by one sixth. The injection power is not strictly proportionate to the ratio of the resistance film width of 10 μm to the diode width of 400 μm because the heat dissipates crosswise within the substrate.

As described, depositing the heater on the surface of the diode surface makes the response time of temperature change around the active layer shorter than the conventional setup of the heater being located at the back of the substrate. In addition, reducing the heater width enhances the energy efficiency for temperature control and further promotes temperature change around the active layer.

Figure 1:
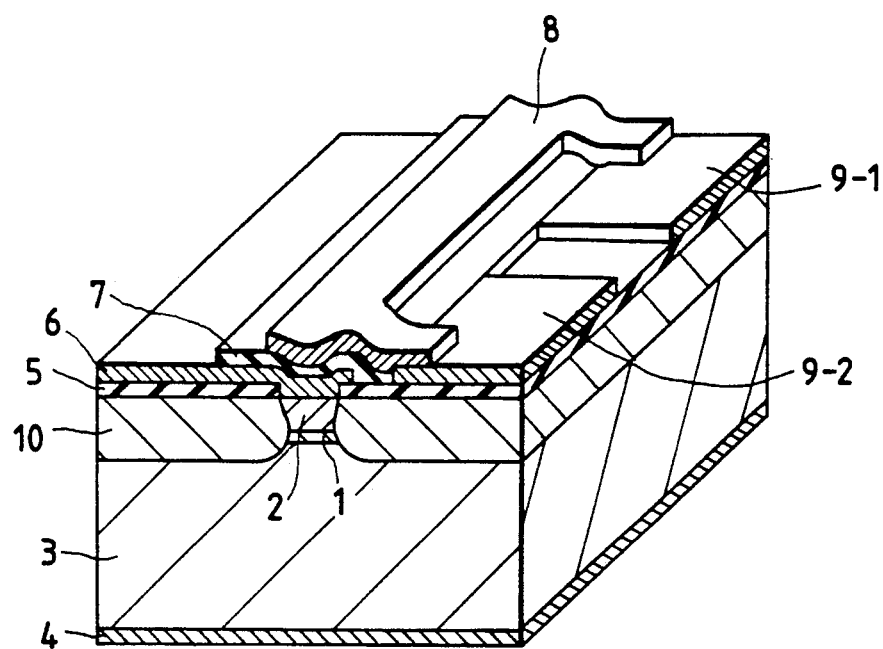
FIG. 1 is a schematic view of a wavelength tunable laser diode embodying the invention.
Figure 2A:
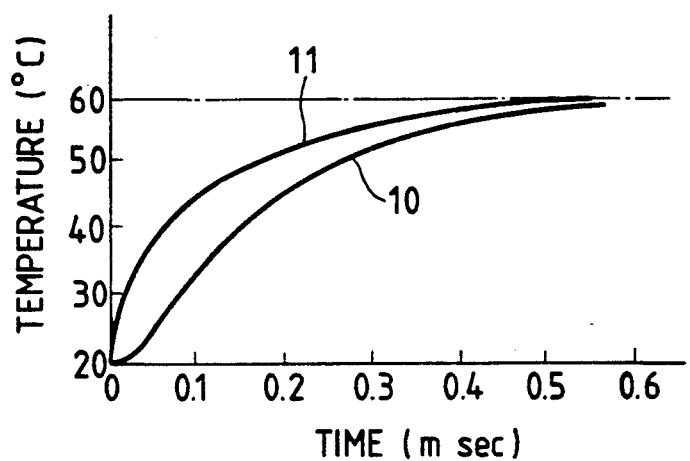
FIG. 2a is a graphic representation of temperature rise versus response time measurements taken in two cases: one in which the semiconductor substrate is heated on the surface thereof and the other from the back thereof.
Figure 2B:
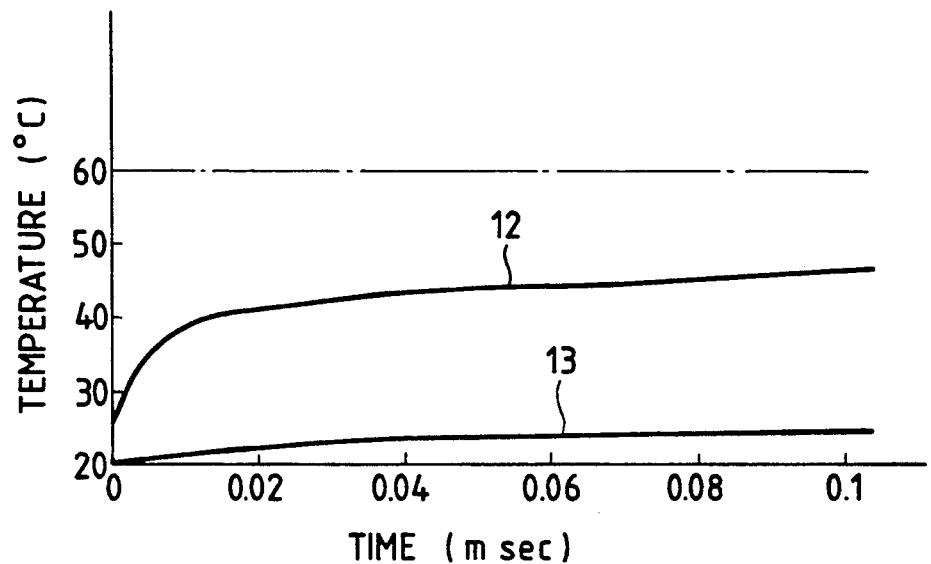
FIG. 2b is a graphic representation of temperature rise versus response time measurements taken in two cases: one in which the entire surface of the substrate is heated by a resistance film, and the other in which part of the substrate surface is heated by the resistance film.

DETAILED DESCRIPTION OF THE PREFERRED EMBODIMENTS:

FIG. 1 is a schematic view showing a wavelength tunable laser diode practiced as one preferred embodiment of the invention. Referring to FIG. 1, an active layer 1 and a p-type InP layer 2 are formed on an n-type InP substrate 3 using the known metal-organic vapor phase deposition epitaxial growth technique. The active layer 1 has a multiple quantum well structure of InGaAs/InGaAsP. After this, the active layer 1 is subjected to etching so that an active layer strip about 1 μm wide is left and the rest removed. An Fe-doped high resistance layer 10 is formed where the active layer 1 was removed so that a carrier is injected only into the remaining active layer 1. Above the active layer 1 is formed an $SiO_2$ film 5 having a window above the remaining active layer strip. Above the film 5 is a p-type electrode 6 made principally of gold (Au) and into which a carrier is injected for laser oscillation. The manufacturing stages so far are the same as those of conventional laser diode manufacture. To implement a wavelength tunable laser having a single wavelength and a narrow spectral line width, there is provided a distributed feedback laser diode structure under the active layer 1 in the optical axis direction (in the direction of depth in FIG. 1). This distributed feedback laser diode structure has a grating 0.24 μm in pitch.

In FIG. 1, on the right-hand side of the p-type electrode 6 are formed electrodes 9-1 and 9-2 in an insular fashion. The two electrodes 9-1 and 9-2 are connected to both ends of a resistance film 8 made of a Pt film. Thereafter, an $SiO_2$ layer 7 about 20 μm wide is deposited on the active layer 1. On top of the layer 7 is formed the Pt film as the resistance film 8 which is 0.7 μm thick and 10 μm wide. As mentioned, the two ends of the Pt film 8 are in contact with the previously formed electrodes 9-1 and 9-2. Finally, an n-type electrode 4 is deposited over the entire back of the substrate 3, the electrode 4 being made primarily of gold (Au).

After producing a specimen 200 μm thick and 400 μm wide in the above-described manner, the inventors attached the back of the specimen to a heat radiation block that could be controlled in temperature using a Peltier device, and tested the specimen for characteristic evaluation. During the test, the block was kept to a constant 20° C. When a carrier of 250 mA was injected into the p-type electrode 6, a laser beam 1.540 μm in wavelength, 1 MHz in spectral line width and 20 mW in optical output power was obtained. When a current of 400 mA was injected into the resistance film 8 via the electrodes 9-1 and 9-2, the temperature rose by 20° C. 10

μs later, with the wavelength shifted by 2 nm to reach 1.542 μm. After a period of 100 μs, the temperature rose by 40° C. and the wavelength moved by 4 nm to the long wave side, reaching 1.544 μm. Within one millisecond after this, feedback control by the receiver produced a laser beam of stable oscillation at 1.544 μm. At this point, the optical output power was 10 mW or higher and the spectral line width 10 MHz or less.

Although one specific embodiment of the invention has been described, the embodiment is not limitative of the invention and may be modified in various ways. For example, the resistance film used as the temperature variable heater may be replaced by an alternative temperature variable heater as long as the alternative heater, located close to and above the active layer, is wider than the active layer and smaller than the laser diode surface area. One such alternative heater is a Peltier device. Where a resistance film constitutes the temperature variable heater, the active layer may be shifted a little off the center and the film may be formed on the side of the active layer. This alternative construction reduces the device size and simplifies the manufacturing process at a tolerable cost of a slight drop in the thermal response characteristic.

As described and according to the invention, the temperature variable heater is provided close to the active layer of the laser diode. This structure widens the tunable range of the laser diode and improves the thermal response characteristic thereof. Illustratively, the embodiment depicted above provides a tunable range of 4 nm within one microsecond. With conventional temperature-controlled laser diodes, the Peltier device is attached to the electrode at the back of the semiconductor substrate not directly but through a heat sink metal block. This has further prolonged the response time of temperature change. The time delay involved entails an overshoot phenomenon. This means that it takes nearly one second to acquire a laser beam of sufficiently stable oscillation. By contrast, the present invention not only improves the response time of temperature change but also stabilizes quickly the temperature near the active layer of the device through the improved response.

Where a resistance film is used as the heater, reducing the film width boosts the injection energy density. This further enhances the response time and energy efficiency, which permits easer control. For example, the above-described embodiment is a wavelength tunable laser diode that provides a laser beam 1.54 μm in wavelength, 1 MHz in spectral line width and 20 mW in optical output power at a response time of one millisecond or less over a tunable range of 4 nm.

As many apparently different embodiments of this invention may be made without departing from the spirit and scope thereof, it is to be understood that the invention is not limited to the specific embodiments thereof except as defined in the appended claims.

What is claimed is:

1. A wavelength tunable laser diode comprising at least:

a compound semiconductor substrate having a first conductivity type, an active layer formed on the surface of said compound semiconductor substrate, said active layer being made of a first compound semiconductor layer with a band gap energy level lower than that a said compound semiconductor substrate, a second compound semiconductor layer formed on said active layer and having a second conductivity type opposite to said first conductivity type, a third compound semiconductor layer formed on said compound semiconductor substrate and adjacent to said active layer and said second compound semiconductor layer, a first electrode disposed on a predetermined portion of said third compound semiconductor layer and electrically connected to the surface of said second compound semiconductor layer, a temperature variable heater disposed above said active layer and separated from said active layer by a distance less than the thickness of said compound semiconductor substrate, at least one second electrode electrically connected to said temperature variable heater and formed above said third compound semiconductor layer, and a third electrode formed on a rear surface of said compound semiconductor substrate.

2. A wavelength tunable laser diode according to claim 1, wherein said temperature variable heater is deposited above said second compound semiconductor layer with said first electrode and said at least one second electrode and an insulation film interposed therebetween.

3. A wavelength tunable laser diode according to claim 2, wherein said temperature variable heater is constituted by a resistance film.

4. A wavelength tunable laser diode according to claim 3, wherein the width of said resistance film is less than that of said compound semiconductor substrate.

5. A wavelength tunable laser diode according to claim 3, wherein said resistance film is made of a platinum.

6. A wavelength tunable laser diode according to claim 3, wherein said resistance film is connected to said at least one second electrode and further comprising a second insulation film deposited on said third compound semiconductor layer, said at least one second electrode being deposited on said second insulation film.

7. A wavelength tunable laser diode according to claim 2, wherein said temperature variable heater is a Peltier device.

8. A wavelength tunable laser diode according to claim 1, wherein said compound semiconductor substrate is constituted by an InP layer.

9. A wavelength tunable laser diode according to claim 1, wherein said active layer has a multiple quantum well structure of GaAs/InGaAsP.

10. A wavelength tunable laser diode according to claim 1, wherein said second compound semiconductor layer is constituted by an InP layer.

* * * * *

UNITED STATES PATENT AND TRADEMARK OFFICE
CERTIFICATE OF CORRECTION

PATENT NO. : 5,173,909
DATED : December 22, 1992
INVENTOR(S) : Shinji Sakano, et. al.

It is certified that error appears in the above-indentified patent and that said Letters Patent is hereby corrected as shown below:

Column 2, line 10, change "develope" to --develop--.

Column 6, line 7, change "a said" to --of said--.

Column 6, line 43, after "mum" insert --film--.

Signed and Sealed this

Ninth Day of November, 1993

*Attest:*

BRUCE LEHMAN

*Attesting Officer*     *Commissioner of Patents and Trademarks*